(12) United States Patent
Hazucha et al.

(10) Patent No.: US 8,373,074 B2
(45) Date of Patent: Feb. 12, 2013

(54) INTEGRATED INDUCTOR

(75) Inventors: Peter Hazucha, Beaverton, OR (US);
Edward Burton, Hillsboro, OR (US);
Trang T. Nguyen, Beaverton, OR (US);
Gerhard Schrom, Hillsboro, OR (US);
Fabrice Paillet, Hillsboro, OR (US);
Kaladhar Radhakrishnan, Gilbert, AZ (US); Donald S. Gardner, Mountain View, CA (US); Sung T. Moon, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 12/590,112

(22) Filed: Nov. 3, 2009

(65) Prior Publication Data

US 2010/0118501 A1 May 13, 2010

Related U.S. Application Data

(62) Division of application No. 11/479,626, filed on Jun. 29, 2006, now Pat. No. 7,636,242.

(51) Int. Cl.
*H05K 1/16* (2006.01)
(52) U.S. Cl. ........................ 174/260; 361/771
(58) Field of Classification Search .................. 174/260; 361/771–774
See application file for complete search history.

(56) References Cited

U.S. PATENT DOCUMENTS

| | | | |
|---|---|---|---|
| 5,784,269 A | 7/1998 | Jacobs et al. | |
| 5,978,231 A * | 11/1999 | Tohya et al. | 361/782 |
| 6,005,197 A * | 12/1999 | Kola et al. | 174/260 |
| 6,362,986 B1 | 3/2002 | Schultz et al. | |
| 6,452,247 B1 | 9/2002 | Gardner | |
| 6,727,154 B2 | 4/2004 | Gardner | |
| 6,856,226 B2 | 2/2005 | Gardner | |
| 6,856,228 B2 | 2/2005 | Gardner | |
| 6,870,456 B2 | 3/2005 | Gardner | |
| 6,880,232 B2 | 4/2005 | La Valle et al. | |
| 6,891,461 B2 | 5/2005 | Gardner | |
| 6,943,658 B2 | 9/2005 | Gardner | |
| 6,988,307 B2 | 1/2006 | Gardner | |
| 7,064,646 B2 | 6/2006 | Gardner | |
| 7,088,215 B1 * | 8/2006 | Winter et al. | 336/200 |
| 7,195,981 B2 | 3/2007 | Lotfi et al. | |
| 7,196,607 B2 * | 3/2007 | Pleskach et al. | 336/200 |
| 7,436,277 B2 | 10/2008 | Hazucha et al. | |
| 2002/0095778 A1 | 7/2002 | Ahn et al. | |
| 2003/0006474 A1 | 1/2003 | Gardner | |
| 2005/0184844 A1 | 8/2005 | Valle et al. | |
| 2005/0270745 A1 | 12/2005 | Chen et al. | |
| 2006/0071649 A1 | 4/2006 | Schrom et al. | |
| 2006/0097380 A1 * | 5/2006 | Sato | 257/706 |
| 2008/0001698 A1 | 1/2008 | Hazucha et al. | |

FOREIGN PATENT DOCUMENTS

| | | |
|---|---|---|
| JP | 10 242339 | 9/1998 |
| JP | 2000 040620 | 2/2000 |
| JP | 2003 152713 | 5/2003 |
| JP | 2005 310864 | 11/2005 |
| KR | 10 0267413 | 10/2000 |
| WO | 2008/003008 A2 | 1/2008 |

OTHER PUBLICATIONS

Notice of Preliminary Rejection mailed Sep. 17, 2010 for Korean Application No. 2008-7031800.

(Continued)

*Primary Examiner* — Jeremy Norris
(74) *Attorney, Agent, or Firm* — Blakely, Sokoloff, Taylor & Zafman LLP

(57) ABSTRACT

An inductor and multiple inductors embedded in a substrate (e.g., IC package substrate, board substrate, and/or other substrate) is provided herein.

11 Claims, 5 Drawing Sheets

OTHER PUBLICATIONS

Notice of Preliminary Rejection mailed Sep. 29, 2011 for Korean Application No. 2008-7031800.
Non-Final Office Action mailed Feb. 21, 2011 for Japanese Patent Application No. 2009-530715.
International Search Report and Written Opinion mailed Mar. 22, 2010 for Int'l Patent Application No. PCT/US2007/072293.
International Preliminary Report on Patentability mailed Apr. 29, 2010 for Int'l Patent Application No. PCT/US2007/072293.
Notice of Allowance mailed Aug. 7, 2009 for U.S. Appl. No. 11/479,626.
Official Letter of tentative rejection mailed May 7, 2012 for Taiwanese Patent Application No. 96123464.

* cited by examiner

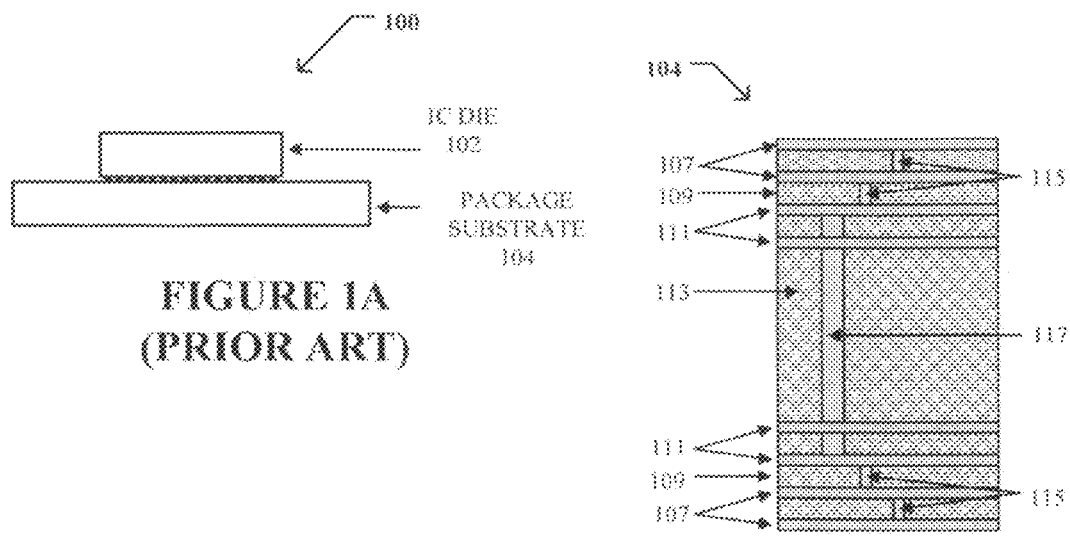
FIGURE 1A (PRIOR ART)
FIGURE 1B (PRIOR ART)
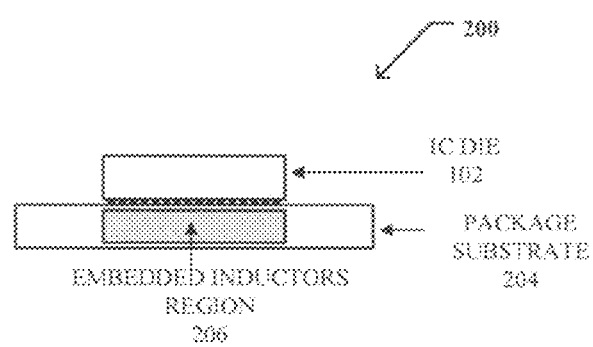
FIGURE 2
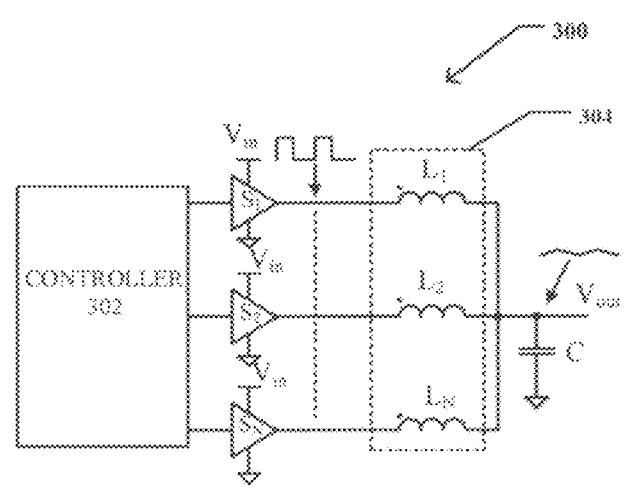
FIGURE 3

US 8,373,074 B2

INTEGRATED INDUCTOR

REFERENCE TO RELATED APPLICATIONS

This application is a divisional of and claims priority to U.S. patent application Ser. No. 11/479,626 titled "INTEGRATED INDUCTOR," which was filed on Jun. 29, 2006 and issued as U.S. Pat. No. 7,636,242 on Dec. 22, 2009; this application is entirely incorporated herein by reference.

BACKGROUND

Inductors are used in a wide variety of integrated circuit applications including voltage regulators such as switching power converters. An inductor is a conductor that is shaped in a manner to store energy in a magnetic field adjacent to the conductor. An inductor typically has one or more "turns" that concentrate the magnetic field flux induced by current flowing through each turn of the conductor in an "inductive" area defined within the inductor turns. In some cases the aspect ratio of the turn can be large so that the turn forms an ellipse or a rectangle. The aspect ratio may be so large that the inductor turn with its return path forms a transmission line.

Inductors have been implemented in integrated circuit dies and circuit packages but they may have several drawbacks. They have typically been made by forming helical or spiral traces in conductive layers (such as in conductive semiconductor or package or printed circuit board substrate layers) to form inductor turns. In some cases, these traces may be coupled to traces in adjacent layers in order to achieve higher inductance and/or current capability. Unfortunately, they can consume excessive trace layer resources and may not provide sufficient current capacity or high enough quality factor without unreasonable scaling. In addition, because their inductive areas are substantially parallel with respect to other trace layers in the package substrate and circuit die, they can have unfavorable electromagnetic interference (EMI) effects on other components within the integrated circuit and/or their inductor characteristics can be adversely affected by adjacent conductors within the substrate or circuit die. Accordingly, a new inductor solution is desired.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 1A is a diagram of a conventional integrated circuit.

FIG. 1B is a sectional view of a portion of a substrate from the integrated circuit of FIG. 1A.

FIG. 2 is a diagram of an integrated circuit with embedded substrate inductors in accordance with some embodiments.

FIG. 3 is a schematic diagram of a power converter with inductors in accordance with some embodiments.

DETAILED DESCRIPTION

Figure 4A:
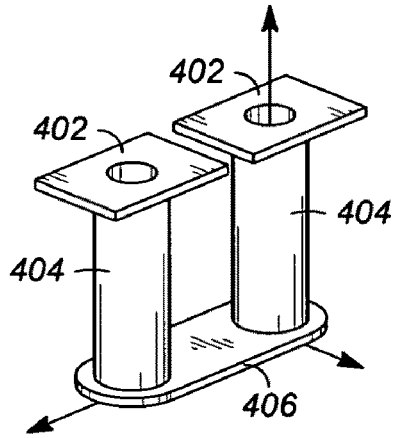
FIG. 4A is a perspective view of an inductor in accordance with some embodiments.

FIG. 1A shows a conventional integrated circuit (IC) 100 generally comprising at least one semiconductor die 102 electrically coupled (e.g., through solder bumps) to a package substrate 104. The die 102 may be electrically coupled to the substrate throughout the majority of its undersurface (as is the case, for example, with a flip-chip type package) which allows for increased external connections with greater current capacity. Within the scope of this patent application, the term "substrate" refers to any substrate that die 102 is mounted on including a dedicated or shared package substrate, interposer substrate or printed circuit board. That is, in some embodiments, die 102 could be mounted on a printed circuit board or on an interposer substrate.

FIG. 1B is a cross-sectional view of the substrate 104 from an IC of FIG. 1A. The substrate 104 comprises an insulative core (e.g., made from organic resin material, plastic, ceramic, or some other suitable material) 113 sandwiched between conductive core layers 111, insulative (e.g., core) layers 109, and conductive build-up layers 107. The die 102 is typically electrically coupled through its contacts on a build-up layer 107 (e.g., "upper" layer) using solder bumps or some other suitable contacts. From there, vias (micro vias 115 and plated through holes 117) electrically couple the die contacts to desired portions (e.g., traces) of the different conductive layers 111, 107 to couple them, for example, to a socket or circuit board housing the substrate.

A plated through hole (PTH) is a type of via. As used herein, the term "via" refers to a conductive member in a substrate that can be used to electrically couple two or more spaced apart conductive layers in a substrate. Plated through holes are normally used to couple traces separated by farther distances, while micro vias 115 are typically used to couple extreme outer (upper and lower) trace layers to adjacent layers. Typically, vias are formed from a hole lined and/or filled with a conducting material (e.g., copper). they are usually disposed perpendicularly to the plane of the substrate but can be angled, so long as they have a perpendicular component thereby allowing them to span two or more layers. Depending on the size of the substrate and number of needed electrical connections, a substrate may have hundreds or thousands of vias and in many cases, have capacity for even more, which is exploited by some embodiments disclosed herein.

FIG. 2 shows an IC 200 in accordance with some embodiments of the invention. It generally comprises at least one IC die 102 electrically coupled to a substrate 204 having a region 206 with one or more embedded inductors in accordance with embodiments disclosed herein. While IC 200 shows only a single die 202, it could comprise a number of additional dies and may perform a variety of functions. For example, in some embodiments, it comprises one or more power converter circuits, such as the circuit described below, using one or more inductors from the embedded inductor region 206.

FIG. 3 shows a multi-phase "buck" type switching power converter with novel inductors 304, configured in accordance with some embodiments. The depicted converter generally comprises a controller (also sometimes referred to as a pulse width modulator) 302 coupled to driver switches (or switches) $S_1$ to $S_N$, which in turn are coupled to inductors, $L_1$ to $L_N$, and capacitor C to generate a regulated DC output voltage $V_{out}$. Typically, the depicted converter is used to "step down" a DC voltage, $V_{in}$, supplied to switches $S_1$ to $S_N$, to a smaller, regulated DC voltage $V_{out}$.

Controller 302 generates trigger signals applied to the switches. Each switch produces a pulse train voltage signal ranging between the applied input value ($V_{in}$) and the low-side reference ($V_{SS}$). The pulse train signal produced from each switch is applied to an input of an associated inductor. The duty cycle of an applied pulse train signal generally determines the magnitude of the voltage generated at the output of the inductor ($V_{out}$).

The converter could operate as a single phase converter with a single driven inductor or as a multi-phase converter with multiple inductors. With a multi-phase converter, the trigger signals for the switches ($S_1$ to $S_N$) are skewed in time (phase shifted) so that switching noise from each inductor is distributed in time. This multi-phase approach serves to reduce the voltage ripple at the output. The capacitor C filters ripple, along with AC noise, from the output DC voltage ($V_{out}$).

Ripple is one characteristic for qualifying a power converter (or converter). The smaller the ripple the better. In general, to achieve a given ripple constraint, smaller inductors can be used in a multi-phase design than could otherwise be used in an analogous single phase implementation because the interleaved phase portions serve to "smooth" the output signal. Another factor is transient response. Transient response time is essentially the time required for the output voltage $V_{out}$ to respond to a change from the controller or to a change in the load current. In sizing the inductors, a trade-off typically exists between ripple and transient response. With larger inductors, ripple reduction improves but transient response time increases. Another factor is converter efficiency, which is the percentage of total power consumed by the converter that goes to the output load (not shown). With the quality (Q) factor defined as the ratio of an inductor's imaginary (inductive) impedance to its real (resistive) impedance, efficiency increases with a higher inductor Q factor. With all of this in mind, the inductor structures disclosed herein and described in the following sections provide a flexible solution for implementing single and multiple inductors with desired inductor characteristics.

Figure 4B:
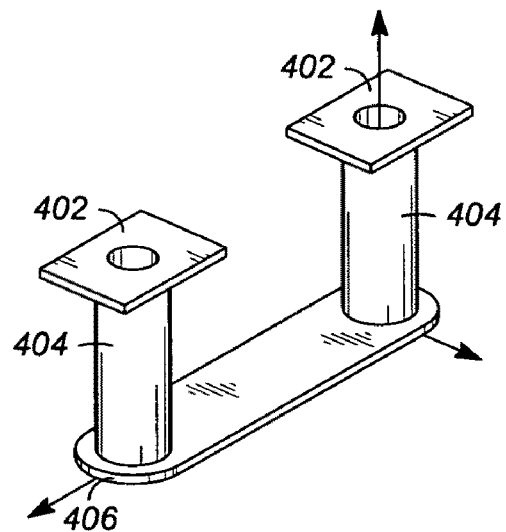
FIG. 4B is a perspective view of an inductor with a wider inductive loop area in accordance with some embodiments.

FIGS. 4A and 4B show inductors in accordance with some embodiments. They comprise spaced apart vias 404 coupled together at common ends with a portion 406 of a conductive layer. At their other ends, they are coupled to conductive layer portions 402, which serve as first and second inductor terminals.

The spaced apart vias 404 and coupling conductive layer portion 406 make up a single inductor "turn" (notwithstanding the fact that the turn is left open between the terminals, although this is not required). Together, the vias and coupling layer portion define a rectangular shaped cross-sectional core area (or inductor area). It is worth pointing out that with the depicted configuration, the inductor areas (loop cross-sections) are substantially perpendicular to the conductor layers within the substrate, which reduces the adverse effect they may have on inductor performance, as well as the negative impact the inductor may have on signals within conductor layer traces.

With its wider coupling portion 406, the inductor of FIG. 4B has a larger inductor loop area than that of the inductor of FIG. 4A and thus, with everything else substantially being the same, has a larger associated inductance. However, depending upon the amount to which its resistance is also larger, its quality factor may or may not be higher.

Figure 5:
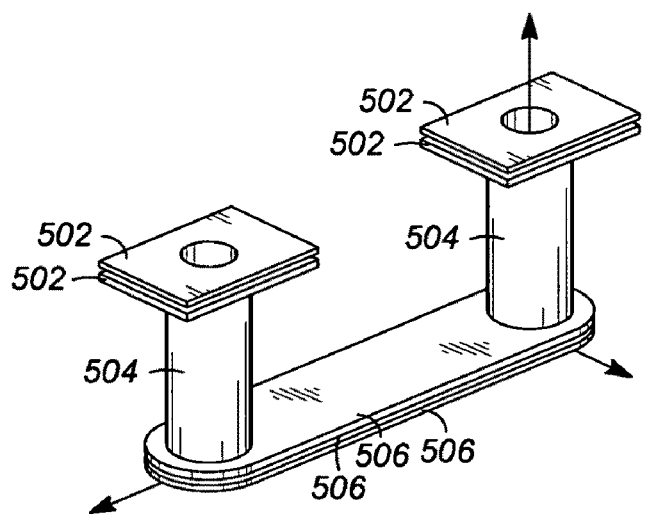
FIG. 5 is a perspective view of an inductor with multiple coupling conductive layers in accordance with some embodiments.

FIG. 5 shows another embodiment of an inductor. As with the inductors of FIGS. 4A and 4B, it has spaced apart vias 504, but instead of a single conductive layer coupling them together, it uses multiple, conductive layer portions 506 to couple the vias together at a common end of the vias. It also uses multiple, conductive layer portions 502 coupled at the other ends for its first and second inductor terminals. Multiple conductive layer portions will typically provide for less inductor resistance, resulting in a higher quality factor and greater current capacity. This can be valuable for power converter applications to achieve increased efficiency and to be able to service larger load demands.

Figure 6:
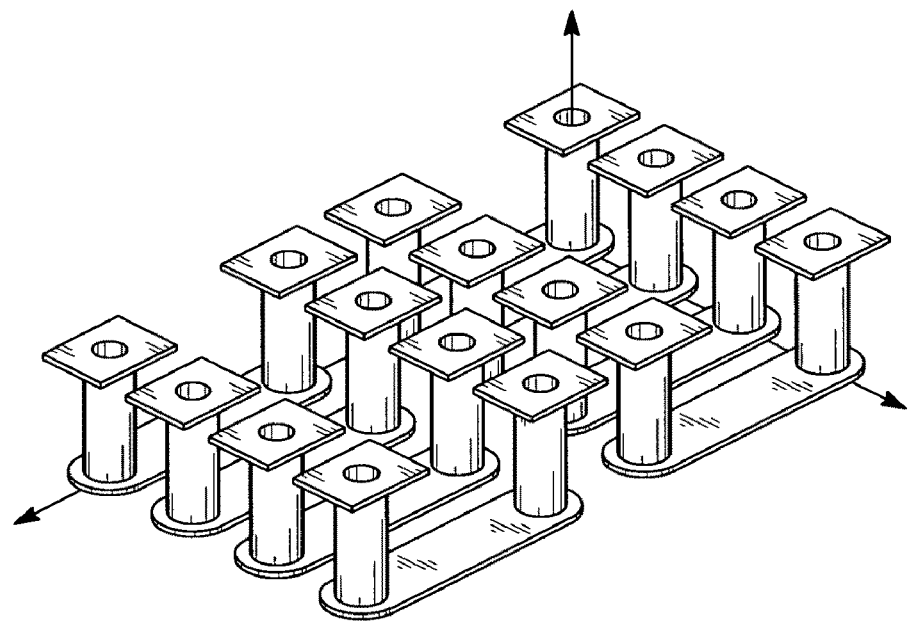
FIG. 6 is a perspective view of multiple inductors arranged in adjacent rows in accordance with some embodiments.

FIG. 6 shows multiple inductors arranged in two adjacent rows, each having four inductors. Each inductor may be configured as an inductor from FIGS. 4A, 4B, or 5, although in the depicted embodiment, the terminal portions and layer portions coupling the vias together are made from a single layer.

Figure 7:
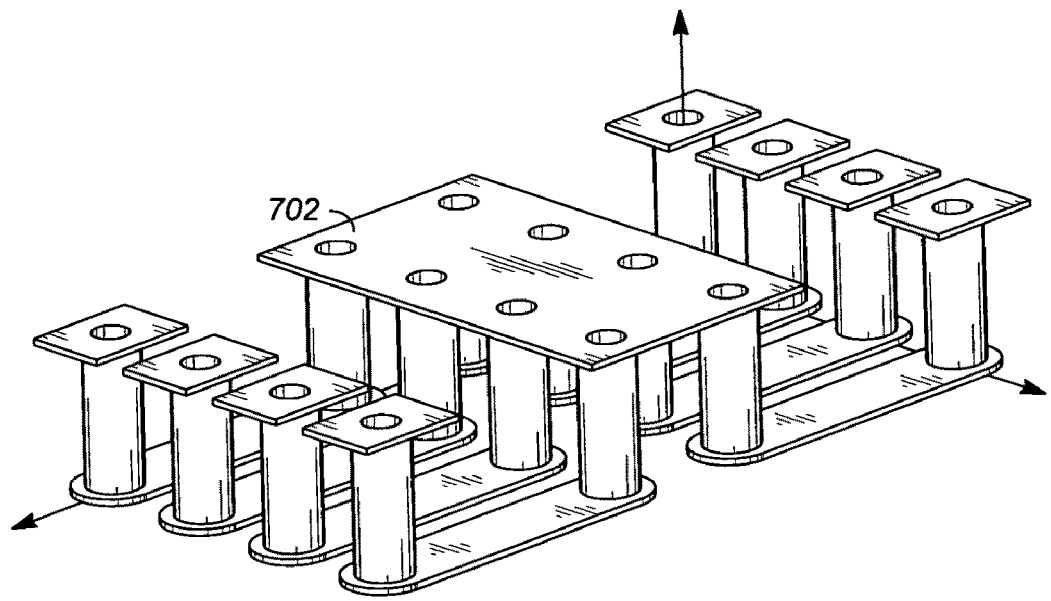
FIG. 7 is a perspective view of the multiple inductors of FIG. 6 with a terminal from each inductor coupled to a conductive layer portion to form a common terminal in accordance with some embodiments.

FIG. 7 shows the inductors of FIG. 6 but with a terminal from each inductor coupled together by a conductive layer portion 702 to form a common terminal. Such a configuration could be used, for example, to implement inductors in a voltage regulator such as the power converter of FIG. 3.

Figure 8:
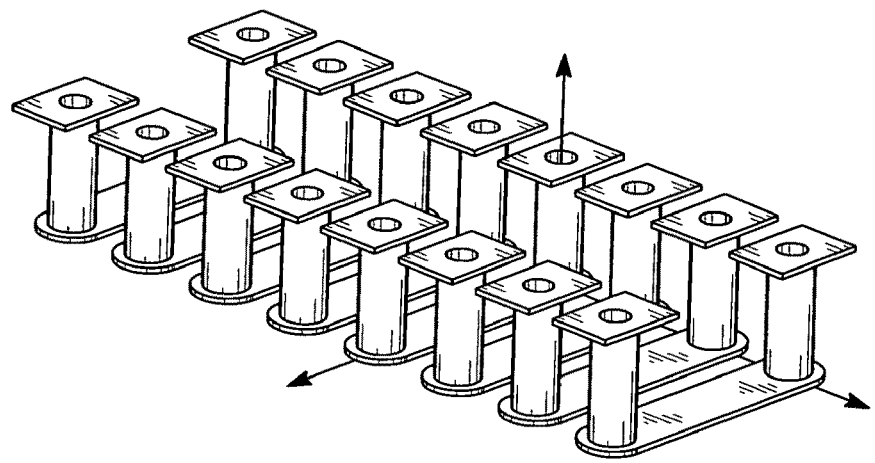
FIG. 8 is a perspective view of multiple inductors arranged in a single row in accordance with some embodiments.

FIG. 8 shows another embodiment of multiple inductors (eight in the depicted embodiment) arranged in a single row. Not only may this allow for larger inductor areas for each inductor, but also, it may provide easier routing access to all of the terminals.

Figure 9:
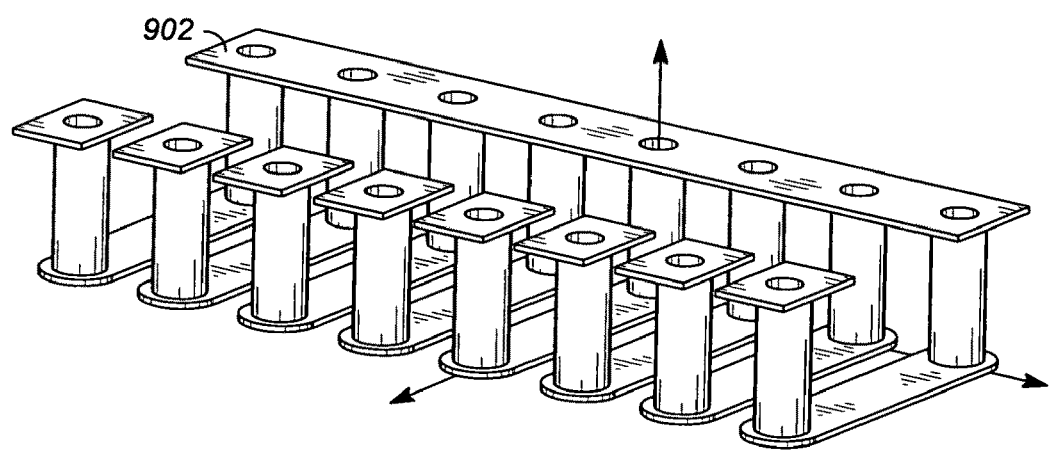
FIG. 9 is a perspective view of the multiple inductors of FIG. 8 with a terminal from each inductor coupled to a conductive layer portion to form a common terminal in accordance with some embodiments.

FIG. 9 shows the multiple inductors of FIG. 8 with a terminal from each inductor coupled to a conductive layer portion 902. This set of commonly connected terminals could provide a common output, e.g., for a multi-phase power converter.

Figure 10:
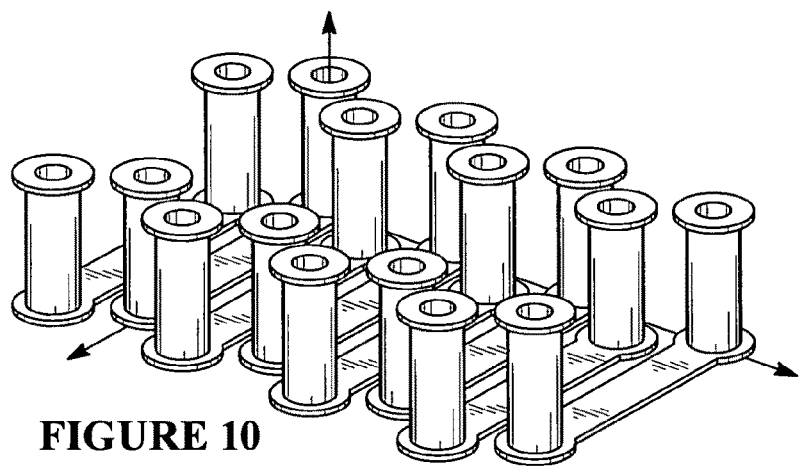
FIG. 10 is a perspective view of multiple inductors arranged in a single row with staggered terminals in accordance with some embodiments.
Figure 11:
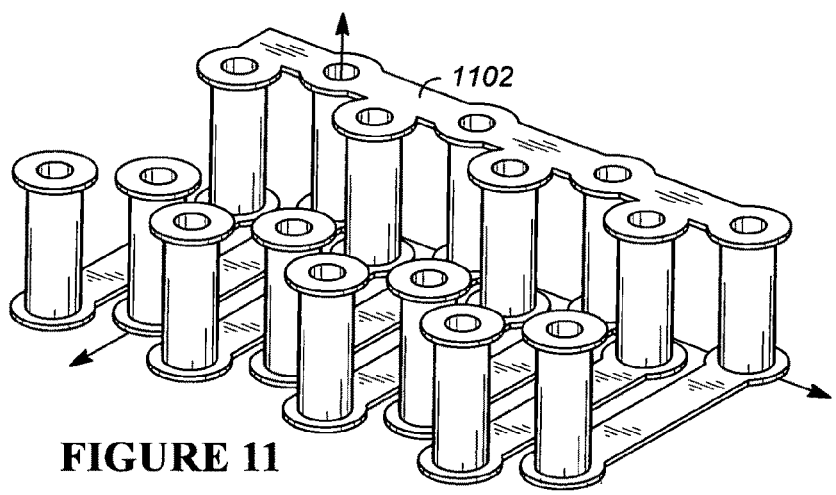
FIG. 11 is a perspective view of the multiple inductors of FIG. 10 with a terminal from each inductor coupled to a conductive layer portion to form a common terminal in accordance with some embodiments.

FIG. 10 shows multiple inductors configured in accordance with other embodiments. It comprises interleavably staggered (or skewed) inductors. As depicted, this allows them to be placed closer to one another with their terminal layer portions for adjacent inductors not being disposed along a common line. FIG. 11 shows the inductors with a terminal from each inductor coupled to a common layer portion 1102 to provide a common terminal for all of the inductors.

It should be appreciated that other embodiments not specifically presented are within the scope of the invention. For example, while the disclosed inductors have inductor areas that are substantially vertical relative to a substrate, it is contemplated that they could also have a horizontal component (i.e., be angled), depending upon design concerns and/or manufacturing preferences. In addition, while the depicted inductors are implemented with plated through hole vias, any other type of via could also be used, depending upon available materials and/or manufacturing processes. They could be formed from layered, deposited, and/or filled holes (e.g., formed from mechanical and laser drilling, milling, sacrificial formations), or they could be made from some other process. Moreover, while the use of magnetic materials is not specifically disclosed, they are not discounted from the scope of the invention and may be used in some embodiments. For example, a magnetic material layer could be disposed "beneath" the inductors to enhance their inductances. However, the use of such a material may not be desired due to process limitations or other detriments. It is anticipated that the inductors disclosed herein may be used in high frequency (e.g., in excess of 10 MHz.) switching applications, which may make it unfeasible to use a magnetic material.

Figure 12:
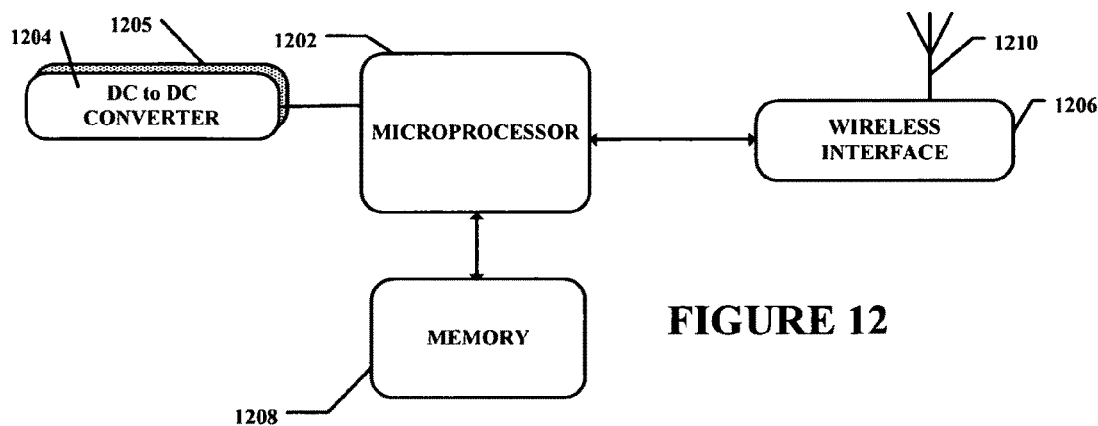
FIG. 12 is a block diagram of a computer system having a power converter with inductors in accordance with some embodiments.

With reference to FIG. 12, one example of a computer system is shown. The depicted system generally comprises a processor 1202 that is coupled to a power converter 1204, a wireless interface 1206, and memory 1208. It is coupled to the converter 1204 to receive from it power when in operation. The wireless interface 1206 is coupled to an antenna 1210 to communicatively link the processor through the wireless interface chip 1206 to a wireless network (not shown). The power converter 1204 comprises a substrate 1205 that includes inductors in accordance with some embodiments disclosed herein.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chipset components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus comprising:
a substrate comprising an inductor formed from spaced apart first and second vias coupled together to provide first and second inductor terminals and to define an inductor area,
wherein the first and second vias are coupled together at common ends by at least one conductive layer portion to form an inductor turn, and
wherein the at least one conductive layer portion comprises two or more parallel conductive layer portions.

2. The apparatus of claim 1, wherein the defined inductor area is substantially rectangular in shape and bounded by said first and second vias and a conductive layer portion that couples them together.

3. The apparatus of claim 1, wherein the first and second vias comprise plated through holes.

4. The apparatus of claim 3, wherein the plated through holes are substantially filled with a conductive material.

5. The apparatus of claim 1, wherein the substrate comprises a magnetic material to enhance characteristics of the inductor.

6. The apparatus of claim 1, wherein the substrate comprises a plurality of the inductors.

7. The apparatus of claim 6, wherein a terminal from each inductor are coupled to a common terminal for a multi-phase power converter circuit.

8. The apparatus of claim 7, wherein the substrate supports a semiconductor die containing at least a portion of the multi-phase power converter circuit.

9. The apparatus of claim 1, wherein the substrate is part of an integrated circuit device.

10. A system comprising:
a wireless interface; and
a processor coupled to the wireless interface, the processor comprising:
a substrate comprising an inductor formed from spaced apart first and second vias coupled together to provide first and second inductor terminals and to define an inductor area,
wherein the first and second vias are coupled together at common ends by at least one conductive layer portion to form an inductor turn and
wherein the at least one conductive layer portion comprises two or more parallel conductive layer portions.

11. A power converter comprising:
a pulse-width modulator (PWM) with an output terminal;
a switch coupled to the output terminal;
an inductor coupled to the switch, the inductor formed in a substrate and formed from spaced apart first and second vias coupled together to provide first and second inductor terminals and to define an inductor area, wherein the first and second vias are coupled together at common ends by at least one conductive layer portion to form an inductor turn and wherein the at least one conductive layer portion comprises two or more parallel conductive layer portions; and
a capacitor coupled to the inductor, the capacitor providing an output voltage.

* * * * *